US007198883B2

(12) United States Patent
Andriessen et al.

(10) Patent No.: US 7,198,883 B2
(45) Date of Patent: Apr. 3, 2007

(54) PROCESSLESS LITHOGRAPHIC PRINTING PLATE

(75) Inventors: Hieronymus Andriessen, Beerse (BE); Catherine Brigouleix, Villenave d' Oron (FR); Alain Tressaud, Pessac (FR)

(73) Assignee: AGFA-Gevaert, Mortsel (BE)

(*) Notice: Subject to any disclaimer, the term of this patent is extended or adjusted under 35 U.S.C. 154(b) by 0 days.

(21) Appl. No.: 11/229,370

(22) Filed: Sep. 16, 2005

(65) Prior Publication Data

US 2006/0068319 A1 Mar. 30, 2006

Related U.S. Application Data

(60) Provisional application No. 60/615,098, filed on Oct. 1, 2004.

(30) Foreign Application Priority Data

Sep. 24, 2004 (EP) ................................. 04104656

(51) Int. Cl.
*G03F 7/09* (2006.01)

(52) U.S. Cl. ................... 430/278.1; 430/302; 430/309; 430/434; 430/435; 430/944; 430/945

(58) Field of Classification Search ............ 430/270.1, 430/278.1, 302, 309, 434, 435, 944, 945
See application file for complete search history.

(56) References Cited

U.S. PATENT DOCUMENTS 4,045,232 A 8/1977 Parkinson
4,777,109 A * 10/1988 Gumbinner et al. ........ 430/155
4,981,517 A 1/1991 DeSanto et al.
5,605,780 A 2/1997 Burberry et al.
5,836,248 A 11/1998 Jarrold et al.
5,836,249 A 11/1998 Chatterjee et al.
5,839,369 A 11/1998 Chatterjee et al.
5,839,370 A 11/1998 Chatterjee et al.
5,855,173 A 1/1999 Chatterjee et al.
5,870,956 A 2/1999 Ghosh et al.
5,893,328 A 4/1999 Ghosh et al.
6,045,969 A * 4/2000 Verschueren et al. .... 430/270.1
6,117,613 A 9/2000 Kawauchi et al.
6,140,392 A 10/2000 Kingman et al.
6,346,365 B1 2/2002 Kawauchi et al.
6,492,093 B2 12/2002 Gaschler et al.
2001/0009129 A1* 7/2001 Kunita et al. ............... 101/453
2002/0006575 A1 1/2002 Gaschier et al.

FOREIGN PATENT DOCUMENTS

EP 0 053 868 A1 6/1982

(Continued)

OTHER PUBLICATIONS

European Search Report in 04 10 4656 (Mar. 3, 2005).

*Primary Examiner*—Barbara L. Gilliam
(74) *Attorney, Agent, or Firm*—Leydig, Voit & Mayer, Ltd.

(57) ABSTRACT

A positive-working, heat-sensitive material for making a lithographic printing plate by direct-to-plate recording is disclosed. The material comprises a hydrophobized grained and anodized aluminum support and a layer comprising a compound capable of converting light into heat provided onto said support, said support being obtainable by RF plasma treatment of a grained and anodized aluminum support in the presence of a fluorine containing gas.

17 Claims, 2 Drawing Sheets

Fitted high resolution F1s XPS spectrum of the invention support 7: kilocounts per second (KCPS) in function of the Binding Energy.

FOREIGN PATENT DOCUMENTS

| | | | |
|---|---|---|---|
| EP | 0 580 393 | A2 | 1/1994 |
| EP | 0 625 728 | A2 | 11/1994 |
| EP | 0 823 327 | A2 | 2/1998 |
| EP | 0 864 420 | A1 | 9/1998 |
| EP | 0 864 622 | A2 | 9/1998 |
| EP | 0 894 622 | A2 | 2/1999 |
| EP | 0 901 902 | A2 | 3/1999 |
| EP | 0 903 223 | A1 | 3/1999 |
| EP | 0 978 376 | A2 | 2/2000 |
| EP | 1 029 667 | A1 | 8/2000 |
| EP | 1 065 051 | A1 | 1/2001 |
| EP | 1 093 934 | A1 | 4/2001 |
| JP | 52 154402 | | 12/1977 |
| WO | WO 97/39894 | A1 | 10/1997 |
| WO | WO 00/29214 | A1 | 5/2000 |
| WO | WO 00/32705 | A1 | 5/2000 |

* cited by examiner

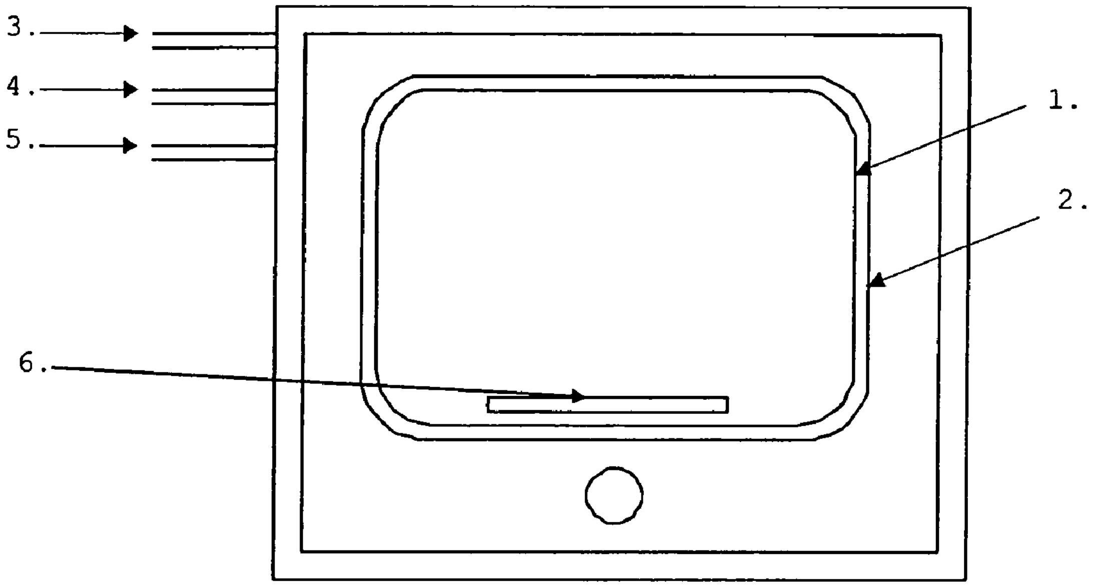
Figure 1: RF Plasma Fluorination reactor.

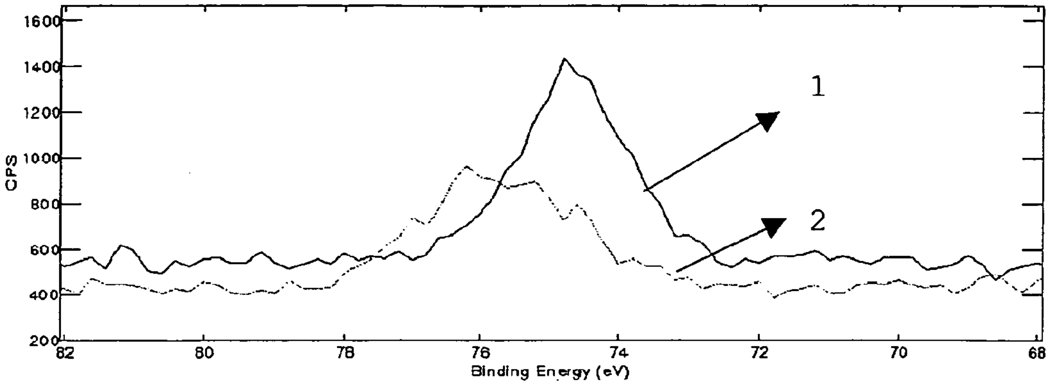
Figure 2: high resolution Al*2p* XPS spectra of the reference aluminium support 0 (curve 1) and of the invention support 7 after $C_3F_8$ plasma treatment (curve 2); counts per second (CPS) in function of the Binding Energy.
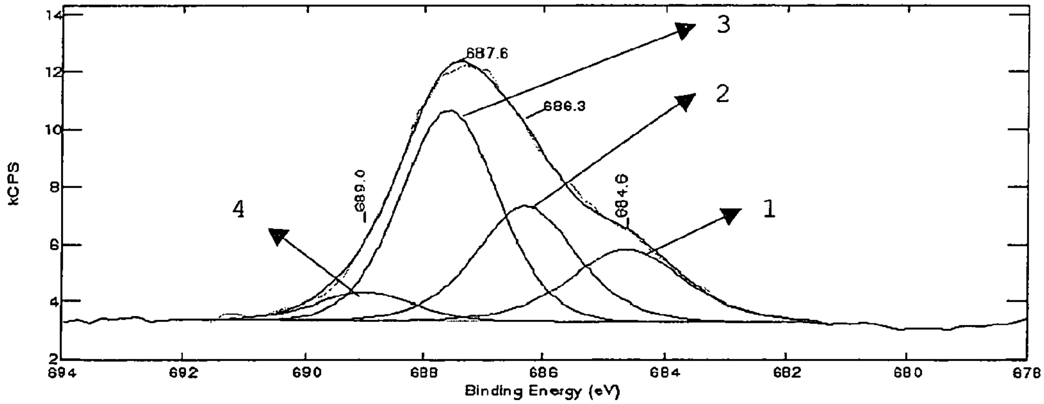
Figure 3: Fitted high resolution F*1s* XPS spectrum of the invention support 7: kilocounts per second (KCPS) in function of the Binding Energy.

PROCESSLESS LITHOGRAPHIC PRINTING PLATE

CROSS-REFERENCE TO RELATED PATENT APPLICATIONS

This application claims the benefit of U.S. Provisional Application No. 60/615,098 filed Oct. 1, 2004, which is incorporated by reference. In addition, this application claims the benefit of European Application No. 04104656.6 filed Sep. 24, 2004, which is also incorporated by reference.

FIELD OF THE INVENTION

The present invention relates to a positive-working, heat-sensitive material which is suitable for making a lithographic printing plate by direct-to-plate recording, and to a method for imaging said heat-sensitive material with heat and/or light.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called “wet” lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by cross linking of a polymer, heat-induced solubilization, or by particle coagulation of a thermoplastic polymer latex.

The most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working embodiments of such thermal materials often require a pre-heat step between exposure and development as described in e.g. EP-A 625,728.

Some of these thermal processes enable plate making without wet processing and are for example based on a heat-induced hydrophilic/oleophilic conversion of one or more layers of the coating so that at exposed areas a different affinity towards ink or fountain is created than at the surface of the unexposed coating.

U.S. Pat. No. 5,855,173, U.S. Pat. Nos. 5,839,369 and 5,839,370 describe a method relying on the image-wise hydrophilic-hydrophobic transition of a ceramic such as a zirconia ceramic and the subsequent reverse transition in an image erasure step. This image-wise transition is obtained by exposure to infrared laser irradiation at a wavelength of 1064 nm at high power which induces local ablation and formation of substoichiometric zirconia. U.S. Pat. No. 5,893,328, U.S. Pat. No. 5,836,248 and U.S. Pat. No. 5,836,249 disclose a printing material comprising a composite of zirconia alloy and $\alpha$-alumina which can be imaged using similar exposure means to cause localized “melting” of the alloy in the exposed areas and thereby creating hydrophobic/oleophilic surfaces. A similar printing material containing an alloy of zirconium oxide and Yttrium oxide is described in U.S. Pat. No. 5,870,956. The high laser power output required in these prior art methods implies the use of expensive exposure devices.

EP 903,223 discloses a lithographic printing method using a printing plate precursor comprising a surface having a thin layer of $TiO_2$, ZnO or a compound selected from the group consisting of $RTiO_3$ wherein R represents an alkaline earth metal atom, $SnO_2$, $Bi_2O_3$ and $Fe_2O_3$. The exposure step renders the surface hydrophilic and subsequent heating results in a hydrophilic/hydrophobic conversion.

Thermal plates of the so-called ablative type neither require a processing step; the differentiation between hydrophilic and oleophilic areas is produced by heat-induced ablation of one or more layers of the coating, so that at exposed areas the surface of an underlying layer is revealed which has a different affinity towards ink or fountain than the surface of the unexposed coating; the image (printing) and non-image or background (non-printing) areas are obtained.

U.S. Pat. No. 5,605,780 discloses a lithographic printing plate comprising an anodized aluminum support and provided thereon an image-forming layer comprising an IR absorbing agent and a cyanoacrylate polymer binder. The image-forming layer is removed by laser-induced thermal ablation whereby the underlying hydrophilic support is revealed.

EP-A 580,393 discloses a lithographic printing plate directly imageable by laser discharge, the plate comprising a topmost first layer and a second layer underlying the first layer wherein the first layer is characterized by efficient absorption of infrared radiation and the first and second layer exhibit different affinities for at least one printing liquid.

EP 1,065,051 discloses a negative-working heat-sensitive material for making lithographic plates comprising in the order given a lithographic base having a hydrophilic surface, an oleophilic imaging layer and a cross-linked hydrophilic upper layer. The heat generated during exposure in the light-sensitive layer removes the hydrophilic upper layer by ablation.

A major problem associated with most ablative plates, however, is the generation of ablation debris which may contaminate the electronics and optics of the exposure device and which needs to be removed from the plate by wiping it with a cleaning solvent, so that ablative plates are often not truly processless. Ablation debris which is deposited onto the plate's surface may also interfere during the printing process and result in for example scumming.

SUMMARY OF THE INVENTION

It is an object of the present invention to provide a positive-working, heat-sensitive material which generates little or no solid state debris upon exposure to heat and/or light and whereby the exposure step can be carried out by means of a laser with low power output. It is a further object to provide a heat-sensitive, positive-working lithographic printing plate which requires no processing step by using the heat-sensitive material.

According to the present invention there is provided a positive-working, heat-sensitive material comprising a hydrophobized, grained and anodized aluminum support and a layer comprising a compound capable of converting light into heat provided onto said support, said support being obtainable by RF plasma treatment of a grained and anodized aluminum support in the presence of a fluorine containing gas.

According to the present invention there is also provided a method for making a positive-working, heat-sensitive printing plate comprising the steps of:

(i) providing a heat sensitive material according to the present invention;

(ii) image-wise exposing said heat-sensitive material with heat and/or light whereby at the exposed areas the contact angle for water is decreased.

Preferred embodiments of the present invention are defined in the dependent claims.

BRIEF DESCRIPTION OF THE DRAWINGS

FIG. 1 shows a schematic presentation of a reactor used for RF plasma fluorination reactions.

FIG. 2 shows a high resolution Al2p XPS spectrum of reference support 0 (curve 1) and invention support 7 (curve 2).

FIG. 3 shows a fitted high resolution Fls XPS spectrum of invention support 7 wherein Curve 1 is associated with Al—F bonds Curve 2, 3 and 4 are associated with C—F bonds.

DETAILED DESCRIPTION OF THE INVENTION

The heat-sensitive material of the present invention comprises a hydrophobized grained and anodized aluminum support which is obtainable by RF plasma fluorination.

RF-plasma fluorination is a process where carrier gas molecules containing fluorine are excited by an RF (radio frequency) source and dissociate into chemically active atoms and molecules. This process is typically carried out in a reactor under reduced pressure (FIG. 1). In the specific embodiment of FIG. 1, the reduced pressure is obtained by means of a vacuum pump equipped with a liquid condenser. The reactor comprises basically two cylindrical barrel aluminum electrodes which are coated with aluminum and which are located within a distance of 2 cm from each other (1 and 2 in FIG. 1) and several gas inlets (3, 4 and 5 in FIG. 1). Gas inlet 3 is used for nitrogen gas, gas inlet 4 is used for oxygen gas and gas inlet 5 is used for the carrier gas molecules containing fluorine. The inner electrode 1 is connected to an RF source, the outer electrode 2 is grounded. The sample to be treated is placed on the inner electrode at the center of the reactor (6 in FIG. 1) where the reaction with the plasma—i.e. the chemically active atoms and molecules—takes place. The plasma results from dissociation reactions of the fluorine containing gas molecules due to electron impacts which occur between the two electrodes.

The sample can optionally be pre-treated before the plasma fluorination process. This pre-treatment may involve exposing the sample with oxygen plasma for 30 minutes at a pressure of 6 Pa and a power of 50 W and at a temperature equal to the temperature that will be used for the plasma fluorination process. This oxygen plasma pre-treatment removes adsorbed airborne organic pollution and oxygen vacancies at the surface of the sample.

Parameters that may be varied during the plasma fluorination process are the pressure, the temperature and the reaction time. The pressure of the gas in the reactor is preferably varied between 3 and 30 Pa, the temperature is preferably thermostatically controlled and maintained at room temperature or a temperature up to 90° C. and the duration of the treatment can take from 15 minutes up to one hour. After the RF plasma treatment, the sample can be washed. More details about the fluorination process are given in the Examples.

The carrier gas is a gas which comprises at least one fluorine atom. More preferably the gas is a hydrocarbon gas comprising at least one fluorine atom. Most preferably the gas is a perfluorated hydrocarbon gas. Suitable examples of such gasses include perfluoromethane, perfluoroethane, perfluoropropane, perfluorocyclopropane, perfluoropropene, perfluorobutane, perfluorocyclobutane, perfluorobutadiene, perfluoropentane perfluoropentadiene, perfluorohexane, perfluoroheptane and octafluoro-2-butene. These gasses are commercially available from for example Air Products Gmbh or Air Liquide. Chemicals which are gaseous under reduced pressure and have a liquid state of aggregation at atmospheric pressure are also suitable as carrier gas and are included in the list.

The grained and anodized aluminum support is preferably grained by electrochemical graining, and anodized by means of anodizing techniques employing phosphoric acid or a sulphuric acid/phosphoric acid mixture. Methods of both graining and anodization of aluminum are very well known in the art.

By varying the type and/or concentration of the electrolyte and the applied voltage in the graining step, different type of grains can be obtained.

By anodizing the aluminum support, its abrasion resistance and hydrophilic nature are improved. The microstructure as well as the thickness of the $Al_2O_3$ layer are determined by the anodizing step, the anodic weight (g/m$^2$ $Al_2O_3$ formed on the aluminum surface) varies between 1 and 8 g/m$^2$.

By RF plasma fluorination of the hydrophilic aluminum support, the support is hydrophobized, or in other words, the hydrophilic support is converted into a support with hydrophobic properties. This conversion from a hydrophilic to a hydrophobic state can for example be characterized by an increase of the contact angle for water measured on the surface: the contact angle for water increases after the treatment of the support indicating a change in hydrophilic/hydrophobic properties. The contact angle is defined as the angle between the tangent of the water droplet at the contact point with the solid and the base of this droplet. In a preferred embodiment, the contact angle shifts from 0° to 30° for a hydrophilic surface to above 100° for a hydrophobic surface.

The hydrophobization of the grained and anodized aluminum support by RF plasma fluorination most probably results in a modification only at the surface of the support and therefore, upon exposure to heat and/or light, only little substance is removed resulting in a limited amount of ablation debris.

The aluminum plates of the present invention were characterized before and after the RF plasma fluorination process with X-ray Photoelectron Spectroscopy (XPS). The XPS measurements were carried out on an ESCALAB VG 220i-XL (available form THERMO VG Scientific) equipped with a Mg non mono-chromatized source at 200 W. A sample with a diameter of about 250 μm was used. Analysis of high resolution XPS spectra of the aluminum supports fluorinated with $C_3F_8$ gas revealed the presence of specific chemical bonds. FIG. 2 shows the high resolution XPS spectra of the Al2p bond of the aluminum support before (curve 1) and after plasma treatment (curve 2). The peak of curve 1 at 74.6 eV of the non-treated aluminum is shifted towards a higher energy (curve 2, about 1.5 eV higher) for the plasma treated aluminum. FIG. 3 shows the diagram of Fls bonds and can be deconvulated into four curves: ionic bonds located at 684.6 eV (curve 1) and covalent bonds located at 686.3 eV (curve 2), 687.6 eV (curve 3) and 689.0 eV (curve 4). The ionic bonds located at 684.6 eV are assigned to Al—F bonds, and the covalent bonds located at 686.3 eV, 687.6 eV and 689.0 eV are assigned to C—F bonds such as for example C—F, C—$F_2$ or C—$F_3$ bonds.

Onto the hydrophobized support a layer is coated which comprises a compound capable of absorbing light and converting the absorbed energy into heat. The compound capable of absorbing light and converting it into heat is preferably an infrared absorbing agent. Preferred IR absorbing compounds are dyes such as cyanine, merocyanine, indoaniline, oxonol, pyrilium and squarilium dyes or pigments such as carbon black. Examples of suitable IR absorbers are described in e.g. EP-As 823327, 978376, 1029667, 1053868, 1093934; WO 97/39894 and 00/29214. A preferred compound is the following cyanine dye IR-A:

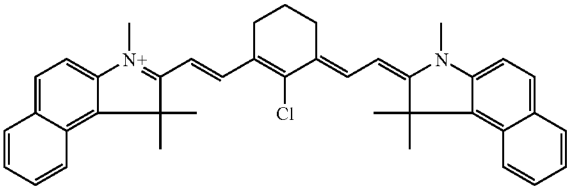

$X^-$ wherein $X^-$ is a suitable counter ion such as tosylate. Even more preferred is a positively charged cyanine dye IR-A having a negative counter ion $X^-$ comprising at least 5 fluorine atoms, more preferably at least 7 fluorine atoms. An example of such a cyanine dye is the following cyanine dye IR-B:

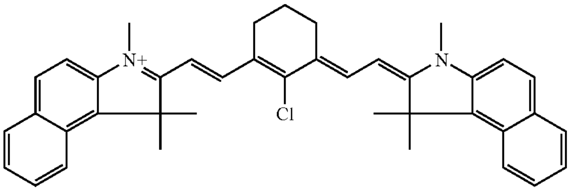

$CF_3—(CF_2)_3—SO_3^-$

The coating may in addition to the layer comprising the infrared absorbing agent also contain one or more additional layer(s) such as i.e. a protective layer or an adhesion-improving layer between the layer comprising the infrared absorbing agent and the support.

Optionally, the layer comprising a compound capable of absorbing light or an optional other layer may further contain additional ingredients. For example binders, surfactants such as perfluoro surfactants, silicon or titanium dioxide particles or colorants may be present.

According to the present invention there is also provided a method for making a positive-working, heat-sensitive printing plate precursor comprising the steps of (i) hydrophobizing a grained and anodized aluminum support by RF plasma treatment of said grained and anodized aluminum support in the presence of a fluorine containing gas and (ii) coating a compound capable of converting light into heat onto said support.

According to the present invention there is further provided a method for making a positive-working, heat sensitive printing plate comprising the steps of (i) providing the heat-sensitive material of the present invention and (ii) image-wise exposing said heat sensitive material with heat and/or light whereby at the exposed areas the contact angle for water is decreased.

The heat-sensitive material of the present invention can be image-wise exposed directly with heat or indirectly with light, preferably infrared light, more preferably near infrared light. The infrared light is preferably converted into heat by an IR light absorbing compound as discussed above. The heat-sensitive material of the present invention is not sensitive to ambient light so that it can be handled without the need for a safe light environment.

The heat-sensitive material of the present invention can be exposed to infrared light by means of e.g. LEDs or an infrared laser. Preferably, the light used for the exposure is a laser emitting near infrared light having a wavelength in the range from about 700 to about 1500 nm, e.g. a semiconductor laser diode, a Nd:YAG or a Nd:YLF laser.

According to the present invention the heat-sensitive material is then ready for printing without an additional development step. The exposure step may optionally be followed by a rinsing step and/or a gumming step. The gumming step involves post-treatment of the heat-sensitive material with a gum solution. A gum solution is typically an aqueous liquid which comprises one or more surface protective compounds that are capable of protecting the lithographic image of a heat-sensitive material or printing plate against contamination or damaging. Suitable examples of such compounds are film-forming hydrophilic polymers or surfactants.

The exposed heat-sensitive material can be mounted on a conventional, so-called wet offset printing press in which ink and an aqueous dampening liquid is supplied to the material. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

Alternatively, the imaging material is first mounted on the printing cylinder of the printing press and then image-wise exposed directly on the press by means of an integrated image recording device. Subsequent to exposure, the imaging material is ready for printing.

EXAMPLES

Invention Example 1

Preparation of the Reference Support 0

A 0.28 mm thick aluminum support was degreased by spraying it with an aqueous solution containing 34 g/l of sodium hydroxide at 70° C. for 5.9 s and rinsing it at room temperature for 3.6 s with a solution containing 12.4 g/l hydrochloric acid and 9 g/l sulphuric acid.

The aluminum support was than electrochemically grained using an alternating current in an aqueous solution containing 12.4 g/l hydrochloric acid and 9 g/l sulphuric acid at a temperature of 37° C. and at a anodization charge density of 54500 Coulomb/$m^2$.

Subsequently, the support was etched with an aqueous solution containing 145 g/l sulphuric acid at 80° C. for 4.8 s and rinsed with water at room temperature for 3.6 s.

After the etching step, the support was subjected for 4.6 s to an anodic oxidation in an aqueous solution containing 145 g/l sulphuric acid and 10 g/l aluminum sulphate at a temperature of 57° C. and a current density of 2500 A/$m^2$. Subsequently, the anodized support was washed with water at room temperature for 3.6 s and dried at 55° C. for 5.3 s.

Subsequently the support was post-anodic treated with 2.2 g/l polyvinylphosphonic acid during 4.2 s at 70° C. and rinsed with water for 1.2 s at room temperature.

The obtained support was processed in a TD6000 developer (trademark of Agfa) at 25° C. during 22 s to remove the post-anodic treatment and subsequently rinsed with water. After this, the substrate was gummed with RC795 (trademark of Agfa).

The grained and anodized aluminum support was washed with water and dried at 40° C. during 15 minutes.

Preparation of the Invention Supports 1–8: $C_3F_8$ RF Plasma Fluorination

The reference support 0 was fluorinated by means of RF plasma fluorination process.

The experiments in RF plasma conditions were carried out in a S.E. 80 Barrel Plasma Technology System.

$C_3F_8$ gas was excited by a RF source at 13.56 MHz and a power of 80 W. A primary vacuum was obtained by a 40 $m^3.h^{-1}$ Edwards E2M40-type pump (trademark of BOC Edwards) equipped with a liquid nitrogen condenser, which traps the residual gases. The reactor contains two cylindrical aluminum barrel electrodes coated with alumina and located at about 2 cm from each other. The grained and anodized aluminum sample (reference support 0) with a size of 37 mm×115 mm was placed onto the inner electrode and connected to the RF source; the outer electrode was grounded. Subsequently, the gas was introduced in the inner part of the reactor and then dissociated by electron impacts occurring between the two electrodes. Neutral species and radicals diffused from this plasma zone to the center of the reactor where they reacted with the sample. After the plasma treatment, the samples were rinsed with water and dried with high pressure air.

In Table 1 the fluorination process parameters—pressure of the gas in the reactor (3 to 30 Pa), temperature (25 to 90° C.), reaction time (15 to 60 minutes) and pre-treatment with oxygen plasma (yes or no)—are indicated. The oxygen plasma pre-treatment involves exposing the sample with oxygen plasma for 30 minutes at a pressure of 6 Pa and a power of 50 W and at a temperature equal to the temperature that is used during the plasma fluorination process.

TABLE 1

Parameter settings applied during the RF plasma fluorination process with $C_3F_8$ gas.

| Invention Support | Pressure Pa | Temperature ° C. | Time min | Oxygen plasma pre-treatment 30 min |
|---|---|---|---|---|
| Support 1* | 3 | 25 | 5 | Yes |
| Support 2 | 3 | 25 | 60 | No |
| Support 3 | 3 | 90 | 60 | Yes |
| Support 4 | 3 | 90 | 60 | No |
| Support 5 | 30 | 25 | 15 | Yes |
| Support 6 | 30 | 90 | 15 | No |
| Support 7 | 30 | 90 | 60 | Yes |
| Support 8 | 30 | 90 | 60 | No |

*support not rinsed with water

After the $C_3F_8$ plasma treatment, the contact angles of the treated samples were measured with a water droplet utilizing a Fibro DAT1100 equipment (trademark of FIBRO system AB). The results are shown in Table 2.

TABLE 2 results of contact angles measurements.

| Invention Support | Contact Angle° Mean value | Standard deviation |
|---|---|---|
| Support 0 | 10 | 10 |
| Support 1 | 110 | 18 |
| Support 2 | 100 | 7 |
| Support 3 | 139 | 2 |
| Support 4 | 132 | 2 |
| Support 5 | 132 | 2 |
| Support 6 | 135 | 1 |
| Support 7 | 136 | 2 |
| Support 8 | 140 | 2 |

The results in Table 2 show a significant increase in contact angle for the plasma treated supports which indicates a hydrophilic/hydrophobic conversion of the surface of the treated samples. The contact angle of a hydrophobic surface is defined as $\geqq 100$.

Invention Example 2

Preparation of the Printing Plates PP1 to PP4

Comparative support 0 (see inventive Example 1) was coated with a doctor blade of 40 μm with a solution of 0.5% of IR-1 in ethanol resulting in printing plate 1 (PP1) and with a solution of 0.5% of IR-2 in ethanol resulting in printing plate 2 (PP2).

Invention support 7 (see inventive Example 1) was coated with a doctor blade of 40 μm with a solution of 0.5% of IR-1 in ethanol resulting in printing plate 3 (PP3) and with a solution of 0.5% of IR-2 in ethanol resulting in printing plate 4 (PP4).

IR-1 and IR-2 are cyanine dyes with a different counter ion: the counter ion of IR-1 contains a perfluoroalkyl chain whereas bromide is the counter ion for IR-2. The chemical structures of IR-1 and IR-2 are given below.

IR-1

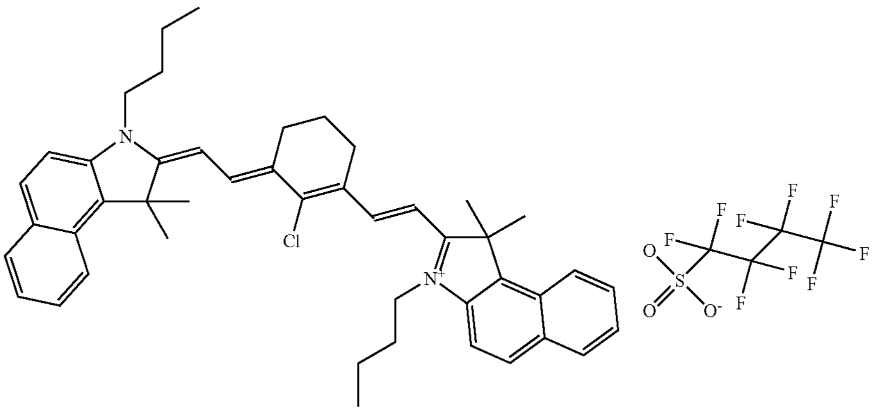

IR-2

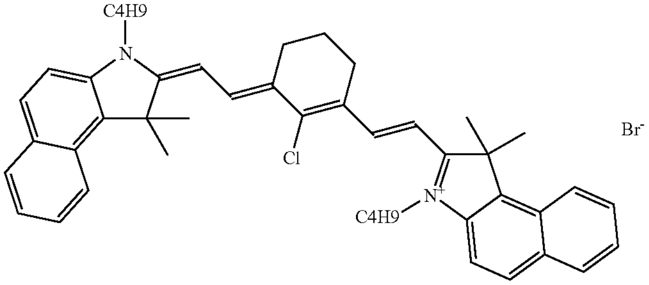

After the coating step, the printing plate precursors were dried at 40° C. during 30 minutes. Subsequently, the printing plate precursors were irradiated with an IR laser diode at 830 nm with a pitch of 7 μm at varying energy densities (Table 3).

TABLE 3

Applied energy densities.

| Laser Setting | Power mW | Drumspeed m/s | Energy density $mJ/cm^2$ |
|---|---|---|---|
| 0 | 0 | 0 | 0 |
| 1 | 200 | 8 | 357 |
| 2 | 280 | 8 | 500 |
| 3 | 280 | 4 | 1000 |

After the exposure step, the obtained printing plates PP1 to PP4 were directly mounted on an ABDick 360 printing press (available from ) and a print job was started without carrying out any processing or rinsing step. During the printing, Van SON 167 ink (trademark of Van Son) was used and Rotamatic (available from Unigrafica GmbH) as fountain liquid. A compressible rubber blanket was used and the prints were made on 80 g offset paper. The ink density was measured on paper by using a GretagMacbeth densitometer Type D19C (available from Gretag Macbeth AG) and the results are summarized in Table 4 (for printing plate PP1), in Table 5 (for printing plate PP3), Table 6 (for printing plate PP2) and in Table 7 (for printing plate PP4**). The values were corrected for the paper density.

TABLE 4

Printing results of comparative printing plate PP1: ink density values.

| Laser setting | Ink density After 250 prints | Ink density After 1000 prints | Ink density After 5000 prints |
|---|---|---|---|
| 0 | 0.01 | 0.01 | 0.01 |
| 1 | 0.03 | 0.01 | 0.01 |
| 2 | 0.03 | 0.01 | 0.01 |
| 3 | 0.02 | 0.01 | 0.01 |

TABLE 5

Printing results of invention printing plate PP3: ink density values.

| Laser setting | Ink density after 250 prints | Ink density After 1000 prints | Ink density After 5000 prints |
|---|---|---|---|
| 0 | 1.30 | 1.40 | 1.40 |
| 1 | 1.10 | 0.20 | 0.01 |
| 2 | 1.00 | 0.50 | 0.02 |
| 3 | 0.02 | 0.00 | 0.01 |

The results of Table 4 show that printing plate PP1 comprising the untreated aluminum support does not retain ink (ink density values≦0.05) whereas the results of Table 5 show the excellent ink-uptake and/or oleophilic properties of the un-exposed printing plate PP3 comprising the plasma treated aluminum support 7 (ink density values≧1). The areas exposed to infrared light (laser setting 3 and after 5000 prints) do not retain ink and have hydrophilic properties (ink density values≦0.05).

TABLE 6

Printing results of comparative printing plate PP2: ink density values.

| Laser setting | Ink density after 250 prints | Ink density After 1000 prints | Ink density After 5000 prints |
|---|---|---|---|
| 0 | 0.01 | 0.01 | 0.01 |
| 1 | 0.01 | 0.01 | 0.01 |
| 2 | 0.02 | 0.01 | 0.01 |
| 3 | 0.03 | 0.01 | 0.01 |

TABLE 7

Printing results of invention printing plate PP4: ink density values.

| Laser setting | Ink density after 250 prints | Ink density After 1000 prints | Ink density After 5000 prints |
|---|---|---|---|
| 0 | 1.30 | 1.30 | 0.01 |
| 1 | 0.02 | 0.01 | 0.01 |
| 2 | 0.01 | 0.01 | 0.01 |
| 3 | 0.00 | 0.01 | 0.01 |

The results of Table 6 show that printing plate PP2 comprising the untreated aluminum support 0 does not retain ink and has hydrophilic properties (ink density values≦0.05). The results of Table 7 show the excellent ink-uptake and/or oleophilic properties of the un-exposed printing plate PP4 comprising the plasma treated aluminum support 7 (ink density values≧1). The areas exposed to infrared light do not retain ink and have hydrophilic properties (ink density values≦0.05).

Invention Example 3

Preparation of Invention Printing Plates PP5 to PP8 Comprising $C_4F_8$ RF Plasma Fluorinated Invention Supports 9–12

Reference support 0 was fluorinated by means of the RF plasma fluorination process utilizing $C_4F_8$ perfluorated gas following the same conditions as described in Invention Example 1. The process parameters applied during fluorination are summarized in Table 8.

TABLE 8

Parameter settings applied during the RF plasma fluorination process with $C_4F_8$ gas.

| Invention Support | Pressure Pa | Temperature ° C. | Time min | Oxygen plasma pre-treatment 30 min |
|---|---|---|---|---|
| Support 9 | 30 | 25 | 15 | Yes |
| Support 10 | 30 | 25 | 60 | Yes |
| Support 11 | 30 | 25 | 60 | No |
| Support 12 | 30 | 90 | 60 | Yes |

After rinsing with water and drying at 40° C. during 30 minutes, invention supports 9–12 and comparative support 0 were coated with a 40 μm doctor blade knife with a 0.5% solution of IR-1 (see Invention Example 2) in ethanol. After the coating step, the printing plates were dried at 40° C. during 30 minutes. Subsequently, the printing plates were irradiated with an IR laser diode at 830 nm with a pitch of 7 μm at varying energy densities (Table 3).

After the exposure step, the printing plates PP5 to PP8 were directly mounted on an ABDick 360 printing press (available from AB DICK) and a print job was started without carrying out any processing or rinsing step. During the printing, Van SON 167 ink (trademark of Van Son) was used and Rotamatic (available from Unigrafica GmbH) as fountain liquid. A compressible rubber blanket was used and the prints were made on 80 g offset paper. The ink density was measured on paper by using a GretagMacbeth densitometer Type D19C (available from Gretag Macbeth AG) and the results are summarized in Table 9. The values were corrected for the paper density.

TABLE 9

Printing results: ink density on paper.

| Printing plate | Density* at laser setting** 0 | 1 | 2 | 3 |
|---|---|---|---|---|
| Reference comprising comparative support 0 | 0.02 | 0.02 | 0.02 | 0.02 |
| PP 5 comprising invention support 9 | 1.15 | 0.04 | 0.02 | 0.01 |
| PP 6 comprising invention support 10 | 1.10 | 0.03 | 0.01 | 0.01 |
| PP 7 comprising invention support 11 | 1.30 | 0.15 | 0.12 | 0.02 |
| PP 8 comprising invention support 12 | 1.20 | 0.04 | 0.04 | 0.01 |

*measured after 250 prints.
**laser settings as defined in Table 3.

The high ink density results (ink density values≧1) obtained for the unexposed plates in Table 9 show that the printing plates comprising $C_4F_8$-plasma treated hydrophilic aluminum supports (PP5 to PP8) are ink-accepting. After exposure to infrared light the printing plates have hydrophilic properties as indicated by the low ink density values (ink density values≦0.05). The reference printing plate comprising the untreated aluminum support 0 (Table 8), does not retain ink (ink density value≦0.05).

The invention claimed is:

1. A positive-working, heat-sensitive material for making a lithographic printing plate by direct-to-plate recording, the material comprising a hydrophobized grained and anodized aluminum support and a layer comprising a compound capable of converting light into heat provided on said support, said support being obtainable by RF plasma treatment of a grained and anodized aluminum support in the presence of a fluorine containing gas.

2. A material according to claim 1 wherein the RF plasma treatment is carried out for a period of 15 to 60 minutes, utilizing a pressure of 3 to 30 Pa at a temperature of 25 to 90° C.

3. A method for making a positive-working, heat sensitive printing plate comprising the steps of:

(i) providing a heat sensitive material according to claim 2; and (ii) image-wise exposing said heat-sensitive material with heat and/or light whereby at the exposed areas the contact angle for water is decreased.

4. A material according to claim 2 wherein the fluorine containing gas is a fluorinated hydrocarbon gas.

5. A material according to claim 2 wherein the fluorine containing gas is a perfluorinated hydrocarbon gas.

6. A materiai according to claim 5 wherein the fluorine containing gas is $C_3F_8$ or $C_4F_8$ .

7. A material according to claim 2 wherein the hydrophobized grained and anodized aluminum support comprises fluorinated hydrocarbon units.

8. A material according to claim 2 wherein the hydrophobized grained and anodized aluminum support comprises perfluorinated hydrocarbon units.

9. A material according to claim 1 wherein the fluorine containing gas is a fluorinated hydrocarbon gas.

10. A material according to claim 1 wherein the fluorine containing gas is a perfluorinated hydrocarbon gas.

11. A material according to claim 10 wherein the fluorine containing gas is $C_3F_8$ or $C_4F_8$ .

12. A material according to claim 1 wherein the hydrophobized grained and anodized aluminum support comprises fluorinated hydrocarbon units.

13. A material according to claim 1 wherein the hydrophobized grained and anodized aluminum support comprises perfluorinated hydrocarbon units.

14. A material according to claim 1 wherein the compound capable of converting light into heat is an infrared absorbing compound.

15. A material according to claim 14 wherein the infrared absorbing compound carries a positive charge and comprises a negative counter ion comprising at least seven fluorine atoms.

16. A method for making a positive-working, heat sensitive printing plate comprising the steps of:

(i) providing a heat sensitive material according to claim 1; and (ii) image-wise exposing said heat-sensitive material with heat and/or light whereby at the exposed areas the contact angle for water is decreased.

17. A method for making a positive-working, heat-sensitive printing plate precursor comprising the steps of:

(i) hydrophobizing a grained and anodized aluminum support by RF plasma treatment of said grained and anodized aluminum support in the presence of a fluorine containing gas; and (ii) coating a compound capable of converting light into heat onto said support, wherein the RF plasma treatment is carried out for a period of 15 to 60 minutes, utilizing a pressure of 3 to 30 Pa at a temperature of 25 to 90° C.

* * * * *